United States Patent
Blanchard

[19]

[11] Patent Number: 6,011,298
[45] Date of Patent: Jan. 4, 2000

[54] HIGH VOLTAGE TERMINATION WITH BURIED FIELD-SHAPING REGION

[75] Inventor: Richard A. Blanchard, Los Altos, Calif.

[73] Assignee: STMicroelectronics, Inc., Carrollton, Tex.

[21] Appl. No.: 08/775,632

[22] Filed: Dec. 31, 1996

[51] Int. Cl.[7] .................................................. H01L 29/06
[52] U.S. Cl. .......................................... 257/653; 257/927
[58] Field of Search ..................................... 257/409, 339, 257/345, 610, 611, 168, 607, 653, 927; 438/911, 965

[56] References Cited

U.S. PATENT DOCUMENTS

| | | | |
|---|---|---|---|
| 4,158,206 | 6/1979 | Neilson | 257/653 |
| 4,374,389 | 2/1983 | Temple | 257/653 |
| 4,630,082 | 12/1986 | Sakai | 257/927 |
| 5,032,878 | 7/1991 | Davies et al. | 257/653 |
| 5,218,226 | 6/1993 | Slatter et al. | 257/653 |

FOREIGN PATENT DOCUMENTS

| | | |
|---|---|---|
| 0 165 644A | 12/1985 | European Pat. Off. . |
| 0 344 514A | 12/1989 | European Pat. Off. . |
| 0 426 252A | 5/1991 | European Pat. Off. . |
| 57-106173 | 7/1982 | Japan ........... 257/653 |
| 57 180164A | 11/1992 | Japan . |
| 1 427 014A | 3/1976 | United Kingdom . |

OTHER PUBLICATIONS

Patent Abstracts of Japan, vol. 007, No. 21 (E–155) Jan. 27, 1983.

Antognetti, *Power Integrated Circuits: Physics, Design, and Applications*, McGraw hill, 1986, pp. 3.1–3.58.

A. Blicher, *Field–Effect and Bipolar Power Transistor Physics*, Academic Press, pp. 53–84, 1981.

*Primary Examiner*—David B. Hardy
*Attorney, Agent, or Firm*—Theodore E. Galanthay; Lisa K. Jorgenson; Robert D. McCutcheon

[57] ABSTRACT

A semiconductor device structure and method are presented for increasing a breakdown voltage of a junction between a substrate of first conductivity type and a device region. The structure includes a region of second conductivity type in the substrate completely buried in the substrate below and separated from the device region. The region of second conductivity type is located a predetermined distance away from the device region. The distance is sufficient to permit a depletion region to form between the region of second conductivity type and the device region, when a first voltage is applied between the device region and the substrate. The distance also is determined to produce a radius of curvature of the depletion region, when a second voltage that is larger than the first voltage is applied between the device region and the substrate, that is larger than a radius of curvature of the depletion region about the device region that would be formed if the region of second conductivity type were not present. Traditional field shaping regions spaced from the device region at a surface of the substrate and spaced from the region of second conductivity type may be used in conjunction with the buried ring, if desired.

53 Claims, 3 Drawing Sheets

HIGH VOLTAGE TERMINATION WITH BURIED FIELD-SHAPING REGION

BACKGROUND OF THE INVENTION

1. Field of the Invention

This Invention relates to improvements in semiconductor devices and methods, and more particularly to improvements in methods and structures for increasing the breakdown voltage of junctions in termination regions of semiconductor devices, and the like, of the type in which junction breakdown voltages are relatively high, for example, in the range above about 60–100 volts, and to methods for making same.

2. Relevant Background

Within the past few years, a dramatic change has taken place in the power semiconductor industry. Through the use of new or improved device structures and technology, MOS transistors have been modified to provide high currents and high voltages. When such devices are used in association with an integrated control circuit in the same chip a very compact and efficient device is provided that is particularly advantageous, compared with separate components.

However, a recurring problem in providing such power devices is maximizing their breakdown voltage. The breakdown mechanisms in power MOS transistors can be caused by at least four mechanisms. An "avalanche breakdown" occurs when the electric field in the semiconductor accelerates carrier into atoms having bound electrons with sufficient energy to generate electron-hole pairs. These carriers are in turn accelerated by the field, resulting in further electron-hole pair production and high currents. A "Zener breakdown" occurs when the electric field is sufficiently high that carriers gain enough energy to tunnel through the junction potential barrier. A "punch-through breakdown" occurs when the depletion region of a reverse-biased junction spreads to another junction in the vicinity, connecting the two junctions by a continuous region and allowing current to flow from one junction to the other. A "dielectric breakdown" occurs when the electric field in a dielectric layer exceeds its dielectric strength, allowing a large current flow through the dielectric, usually permanently destroying it. The avalanche breakdown mechanism is of primary interest herein, as the Zener, punch-through, and dielectric breakdown mechanisms are usually minimized in a properly designed device.

In this light, in the context of an MOS device, the breakdown voltage is a decreasing function of the dopant concentration in the drain region of the power device, and is an increasing function of the curvature radius of the body/drain junction therein. To date, the problem has been addressed by appropriate terminations of this junction. In the construction of discrete or integrated VDMOS transistors, the breakdown voltage, which should be as high as possible, and the ON-resistance of the device, which should be as low as possible, are simultaneously optimized. The optimization of these two basic parameters depends on the adoption of an edge configuration apt to achieve a breakdown voltage as close as possible to the theoretical breakdown voltage of a planar junction with an infinite radius of curvature of its perimeter in the direction of the depth of the junction. Such a junction is often referred to as a "plane" junction.

Typical terminations include, for example, dielectric or metallic field plates, floating or field limiting rings, low dopant concentration regions, and so forth. A review of some of these techniques can be found in A. Blicher, *Field-Effect and Bipolar Power Transistor Physics*, Academic Press, pp. 53–84, 1981, and in "POWER INTEGRATED CIRCUITS: Physics, Design, and Applications" Antognetti, McGraw-Hill Book Company, (1986), pp. 3.1–3–58.

A side cross sectional view of a portion of a terminating structure 10 of the type that uses floating surface rings to a achieve a high voltage breakdown is shown in FIG. 1. The terminating structure 10 is formed in an epitaxial layer 12 which is lightly doped with a donor impurity to provide the N− epitaxial layer shown. A device region 14 (such as a body region of a vertical power DMOS device, or the like) is formed in the epitaxial layer 12 of highly doped acceptor type impurities to provide a P+ region, as known in the art.

A number of rings 16–19 are provided encircling the associated semiconductor device at the surface of the epitaxial layer 12. The rings 16–19 are spaced concentrically outwardly from the semiconductor device (not completely shown) at its lateral edge or periphery within the epitaxial layer 12. A dielectric layer 22 overlies the rings 16–19 and the epitaxial layer 12 to isolate them from the structures formed thereover. Metal region 24 provides electrical contact to the device region 14, while metal region 26 is the conductor that terminates the high field region.

Another technique that has been used to terminate semiconductor devices is shown by the structure shown in the side cross-sectional view of FIG. 2, in which progressively shallower, lightly doped rings 32 and 34 are used to achieve a high breakdown voltage. More specifically, the adjacent concentric rings 32 and 34 are formed in the epitaxial layer 36 at surface regions adjacent to a region 38 of an semiconductor device (not completely shown).

The device region 38 is constructed with an acceptor type impurity to provide a P+region, and, similarly, concentric lightly doped rings 32 and 34 are doped with lighter doses of acceptor impurities to provide P− and P−−regions, respectively. An overlying dielectric region 40 is provided over the surface regions of the device region 38, lightly doped rings 32 and 34, and epitaxial layer 36, and metal contact 44 is provided to establish electrical contact to the device 38 while metal region 46 is the conductor that terminates the high field region.

As shown in FIG. 3, a side cross-sectional view of another structure 50 is shown for terminating a semiconductor device. The structure 50 uses a single, deep lightly doped ring 52 to insure a high breakdown voltage. The deep lightly doped ring 52 is formed adjacent to the device region 54, both being formed at the surface of the epitaxial layer 56, which is lightly doped with a donor impurity. In the embodiment shown, both the device region 54 and lightly doped ring 52 are doped with an acceptor type impurity.

A dielectric layer 58 is formed over the surface areas of the device region 54, lightly doped ring 52, and epitaxial region 56, as shown, and metal contact 60 is provided to contact the device region 54 while metal region 62 is the conductor that terminates the high field region.

Still another embodiment of a known termination structure 70 is shown in the side cross-sectional view of FIG. 4, in which the terminating structure 70 includes a plurality of deep, lightly doped rings 72 and 74 at the surface of the epitaxial region 78 to achieve a high breakdown voltage. The structure 70 is similar to the structure 30 described above with respect to FIG. 2, except for the depth of the lightly doped rings 72 and 74 adjacent the device 76.

A dielectric layer 80 overlies the surface regions of the lightly doped rings 72 and 74, as well as portions of the device 76 and substrate 78. Metal contact 82 is provided to the device 76 while metal region 84 is the conductor that terminates the high field region.

What is needed, therefore, is a method and apparatus for providing an improved method and structure for increasing the breakdown voltage of junctions that have been fabricated using planar diffusion technologies in power semiconductor devices, or the like.

SUMMARY OF THE INVENTION

In light of the above, therefore, it is an object of the invention to provide an improved method and structure for increasing the breakdown voltage of junctions of semiconductor devices that have been fabricated using planar diffusion technologies.

It is another object of the invention to provide an improved method and structure for shape the depletion region at the perimeter of a device junction in a semiconductor device.

It is another object of the invention to provide an improved method and structure of the type described for increasing the breakdown voltage of junctions in power integrated circuits, or the like, without increasing the required integrated circuit area.

It is still another object of the invention to provide an improved method and structure of the type described for increasing the breakdown voltage of junctions in power integrated circuits, or the like, without significantly increasing the required thickness of an overlaying epitaxial layer used in conjunction therewith.

These and other objects, features and advantages of the invention will be apparent to those skilled in the art from the following detailed description of the invention, when read in conjunction with the accompanying drawings and appended claims.

Thus, according to a broad aspect of the invention, a semiconductor device is presented that has a substrate of first conductivity type and a device region in the substrate of second conductivity type. A region of second conductivity type in the substrate completely buried in the substrate at a depth below and separated from the device region. The region of second conductivity type may be a ring encircling the semiconductor device with a lower doping concentration than the device region.

The region of second conductivity type is located at a distance away from the device region sufficient to permit a depletion region to form between the region of second conductivity type and the device region, when a first voltage is applied between the device region and the substrate, and to produce a radius of curvature of the depletion region, when a second voltage that is larger than the first voltage is applied between the device region and the substrate, that is larger than a radius of curvature of the depletion region about the device region that would be formed if the region of second conductivity type were not present. When viewed from above, the region of second conductivity type may continuously encircle the perimeter of the device, or, alternatively, may be formed of a number of discrete regions that have overlapping depletion regions and encircle the device.

In one embodiment, a field shaping region spaced from the device region at a surface of the substrate and spaced from the region of second conductivity type. The region of second conductivity type is located at a distance away from the field shaping region sufficient to permit a depletion region to form between the region of second conductivity type and the field shaping region, when a first voltage is applied between the device region and the substrate, and to produce a radius of curvature of the depletion region, when a second voltage that is larger than the first voltage is applied between the device region and the substrate, that is larger than a radius of curvature of the depletion region about the field shaping region that would be formed if the region of second conductivity type were not present. As mentioned, when viewed from above, the region of second conductivity type may continuously encircle the perimeter of the device, or, alternatively, may be formed of a number of discrete regions that have overlapping depletion regions and encircle the device.

According to a broad aspect of the invention, a semiconductor device is presented that has a substrate of first conductivity type and a device region in the substrate of second conductivity type. A region of second conductivity type in the substrate completely buried in the substrate at a depth below and separated from the device region. The region of second conductivity type may be a continuous ring encircling the semiconductor device with a lower doping concentration than the device region, or may be a ring formed of a number of discrete regions that have overlapping depletion regions that encircle the device.

According to another broad aspect of the invention, a semiconductor device structure is presented for increasing a breakdown voltage of a junction between a substrate of first conductivity type and a device region. The structure includes a region of second conductivity type in the substrate completely buried in the substrate below and separated from the device region.

According to yet another broad aspect of the invention, a method is presented for increasing a breakdown voltage of a semiconductor device. The method includes providing a substrate of first conductivity type having a device region of second conductivity type therein, and forming a region of second conductivity type in the substrate completely buried in the substrate at a depth below and separated from the device region.

According to another broad aspect of the invention, a semiconductor device structure is presented for increasing a breakdown voltage of a junction between a substrate of first conductivity type and a device region. The structure includes a region of second conductivity type in the substrate completely buried in the substrate below and separated from the device region.

According to yet another broad aspect of the invention, a method is presented for increasing a breakdown voltage of a semiconductor device. The method includes providing a substrate of first conductivity type having a device region of second conductivity type therein, and forming a region of second conductivity type in the substrate completely buried in the substrate at a depth below and separated from the device region.

BRIEF DESCRIPTION OF THE DRAWINGS

The aforementioned and other features and objects of the present invention and the manner of attaining them will become more apparent, and the invention itself will be best understood, by reference to the following description of a preferred embodiment take in conjunction with the accompanying drawings, wherein.

In the various figures of the drawing, like reference numerals are used to denote like or similar parts.

DETAILED DESCRIPTION OF THE PREFERRED EMBODIMENTS

It should be noted that the process steps and structures herein described do not necessarily form a complete process flow for manufacturing discrete vertical power DMOS transistors by themselves or in integrated circuits. It is anticipated that the present invention may be practiced in conjunction with discrete device or integrated circuit fabrication techniques currently used in the art, and only so much of the commonly practiced process steps are included as are necessary for an understanding of the present invention.

Although the structure and method of the invention may be particularly well suited for use in conjunction with MOS gated power devices, as will become apparent the invention may be practiced with virtually any semiconductor device, for example, diodes, bipolar transistors, MOS transistors, and the like, in which breakdown voltage considerations are important, Region 96, for example, may be a source or drain of a MOS transistor, a base element of a bipolar transistor, or an anode of a diode.

Figure 1:
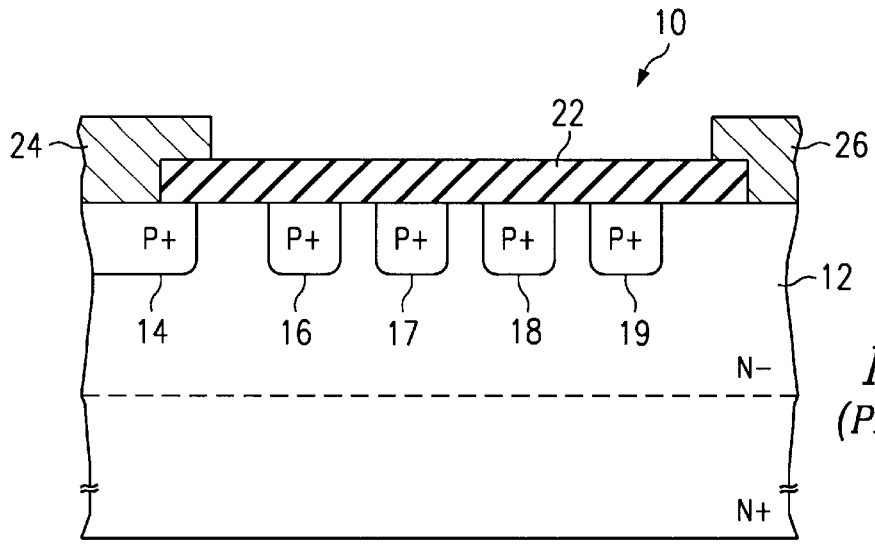
FIG. 1 is a side cross-sectional view of a portion of a termination region for a vertical power DMOS transistor of the type that uses floating rings to achieve a high voltage breakdown, according to prior art techniques.
Figure 2:
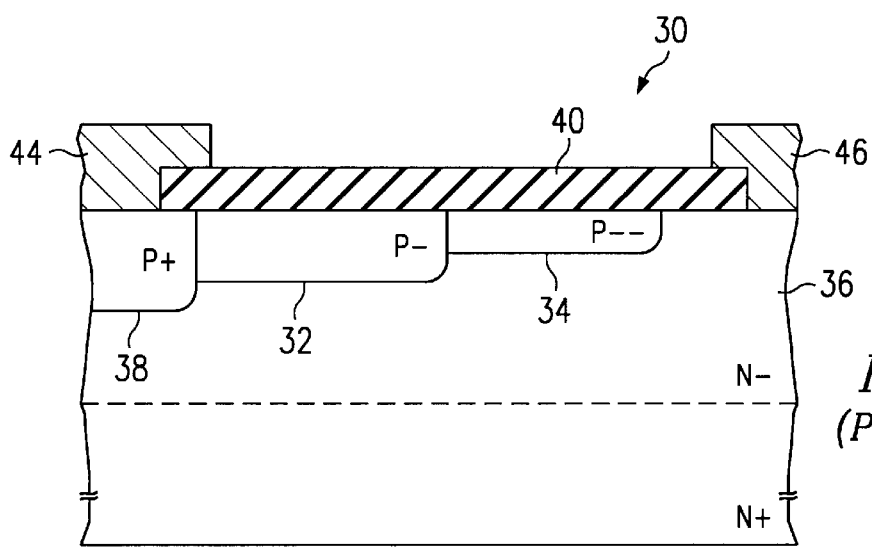
FIG. 2 is a side cross-sectional view of a portion of a termination region of a vertical power DMOS transistor using progressively shallower lightly doped rings to achieve a high breakdown voltage, according to prior art techniques.
Figure 3:
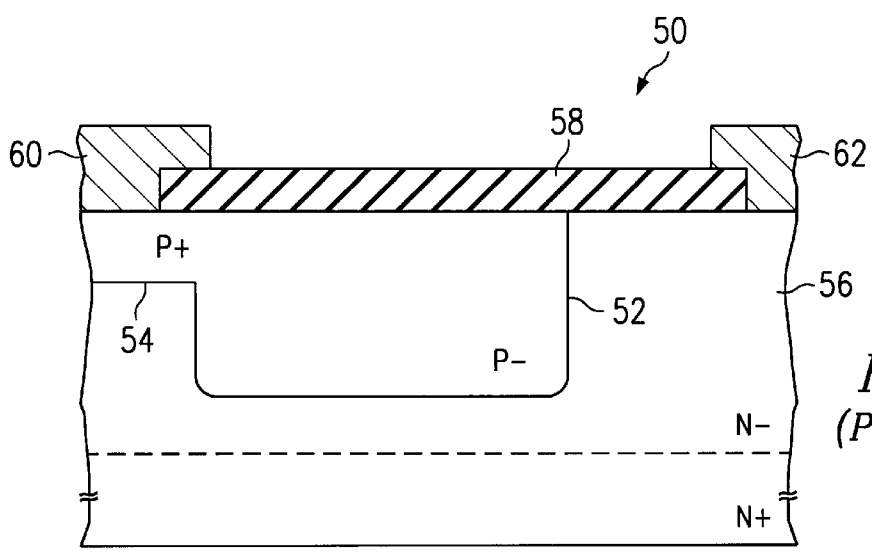
FIG. 3 is a side cross-sectional view of a portion of termination region of a vertical power DMOS transistor using a single, deep, lightly doped ring adjacent a doped device region to achieve a high breakdown voltage, according to prior art techniques.
Figure 4:
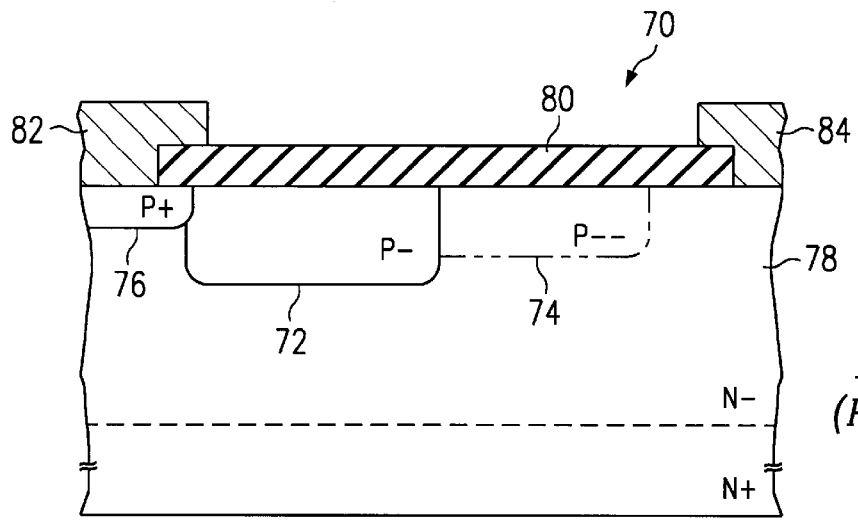
FIG. 4 is a side cross-sectional view of a portion of a termination region of a vertical power DMOS transistor using a deep lightly doped ring with a surrounding shallower, lightly doped ring to achieve a high breakdown voltage, according to prior art techniques.
Figure 5A:
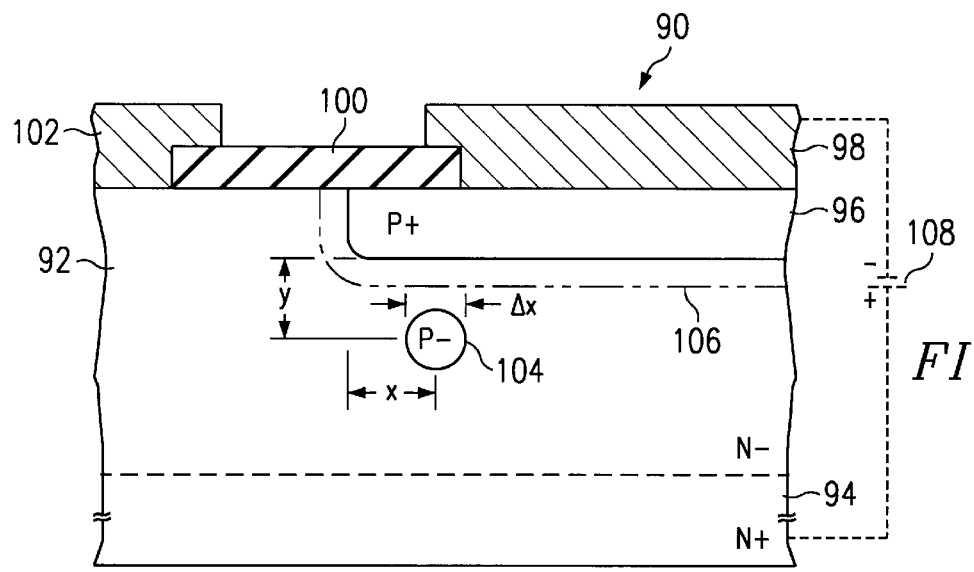
FIG. 5a is a side cross-sectional view of a portion of a termination region of a semiconductor device, showing a buried field shaping ring and the main transistor junction, together with a depletion region that results when a small reverse voltage is applied, in accordance with a preferred embodiment of the invention.

A side cross-section view of a portion of a terminating structure 90 for a semiconductor device is shown in FIG. 5a. The structure 90 is formed in a substrate 92, which may be epitaxially formed silicon that is lightly doped with a donor impurity, and which may be formed on a substrate 94 that has been heavily doped, also with the donor impurity. The device region 96, which may, for example, be a body or other region of a MOS-gated device, a base or other region of a bipolar transistor, an element of a diode, or a region of another semiconductor device, is located at a surface area and within the epitaxial layer 92.

Electrical contact is made to the device region 96 by an overlying metal contact 98. The junction between the device region 96 and the epitaxial region 92 at the surface region thereof is covered with a dielectric layer 100, and a metal contact 102 is provided to contact the epitaxial region 92 and terminate the electric field. In the environment illustrated, the device region 96 is heavily doped with an acceptor type impurity, to provide a P+ region, although it should be understood that in other structures, regions of different conductivity type may be employed.

In accordance with the preferred embodiment of the invention, a region 104 is provided in the epitaxial layer 92. The region 104 may be lightly doped with an acceptor impurity to provide a P– region, which may be formed in the shape of a ring that essentially surrounds the semiconductor device (not completely shown) with which it is associated. When viewed from above (not shown), the region 104 may continuously encircle the perimeter of the device, or, alternatively, may be formed of a number of discrete regions that have overlapping depletion regions and encircle the device.

When a voltage 108 is applied between the device region 96 and the substrate 94, a depletion region 106 is formed between the device region 96 and the implanted region 104. The voltage is relatively small, less than, for example, the normal breakdown voltage of the junction between the device region 96 and the epitaxial layer 92. Typically, for example, the voltage 108 would be connected at one end to the overlying metal contact region 98 and at the other end to the N+ substrate 94. In a discrete semiconductor device, a metal contact region (not shown) may be provided to the backside of the substrate 94 by which connection can be established. In an integrated circuit configuration, on the other hand, a deep diffusion (not shown) between the metal contact 102 through the epitaxial region 92 to the underlying N+ substrate 94 may be provided for the necessary voltage contact.

The field shaping region 104 may be formed by implanting a predetermined dose, Q, of dopant into the epitaxial layer 92. For example, in the embodiment illustrated, a predetermined dose, Q, of acceptor impurity, such as boron, has been implanted to form a buried ring, separated from and beneath the device region 96. As will become apparent, the distance, y, between the buried field shaping region 104 and the device region 96 is determined to be that at which, as the voltage 108 is increased, the depletion region 106 will advance into the region of the buried field shaping region 104 before breakdown voltage is reached for the particular device being considered.

Figure 5B:
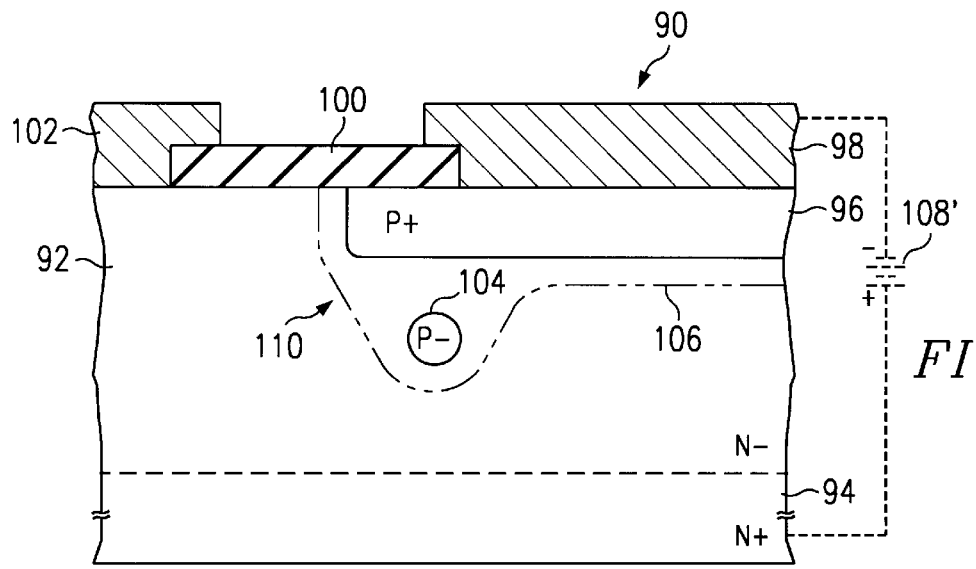
FIG. 5b is a side cross-sectional view of a portion of the termination region of the semiconductor device of FIG. 5a, showing the buried field shaping ring and the main transistor junction, together with the depletion region that results when a large reverse voltage is applied, in accordance with a preferred embodiment of the invention.

With reference additionally now to FIG. 5b, as the voltage 108 is continued to be increased, the depletion region 106 is influenced by the presence of the field shaping buried region 104, to produce a depletion region configuration having a large radius of curvature 110 extending from a location laterally away from the device region 96 at the surface of the epitaxial layer 92 to beneath the field shaping buried region 104. This larger radius of curvature has the effect of increasing the breakdown voltage of the device.

In addition to the vertical spacing, y, from the device region 96 described above, the horizontal spacing x, is also determined to provide the necessary or desired configuration of the radius of curvature 110 when the large reverse voltage is applied. Additionally, the width of the implant of the buried field shaping region 104, $\Delta x$, also may be taken into consideration to determine the configuration of the radius of curvature of the depletion region 106. It should be noted that the vertical dimension of the implanted region 104 is automatically determined by the implant energy and dose used in the formation of the buried field shaping region 104.

In the formation of the buried field shaping region 104, the precise x and y locations, the width Δx, and charge Q, can be determined for each particular semiconductor device with which the structure and method are associated. Typically, for example, the effect of a particular buried field shaping region can be simulated using available simulation tools to determine an approximation of the resulting radius of curvature or depletion configuration resulting from the presence of the buried field shaping region. Thereafter, for more precise determination, experimentation may be performed to achieve a precise depletion region configuration.

It can be seen that the resulting structure by virtue of the use of the varied field shaping region 104 is smaller than those that result from the breakdown voltage increasing techniques described with respect to FIGS. 1–4, and, also, provides a nearly equal on-resistance or voltage drop for the same breakdown voltage. Moreover, it should be noted that as the voltage is increased the radius of curvature of the depletion region 106 that results as the depletion region passes the buried field shaping region 104 is larger than would have resulted if the buried field shaping region 104 were not present; that is, from that inherently produced at the junction between the device region 96 and the epitaxial layer 92.

In the construction or formation of the buried field shaping region 106, a mask (not shown) having an opening through which the forming implant is performed is provided on the surface of the epitaxial layer 92. The mask opening will affect the ultimate size or width, Δx, of the final resulting buried field shaping region 104. As known, there is a relationship between the scattering effects of the implant through a mask opening with the depth of the implant, which is a function of the energy at which the implant is performed.

Figure 6A:
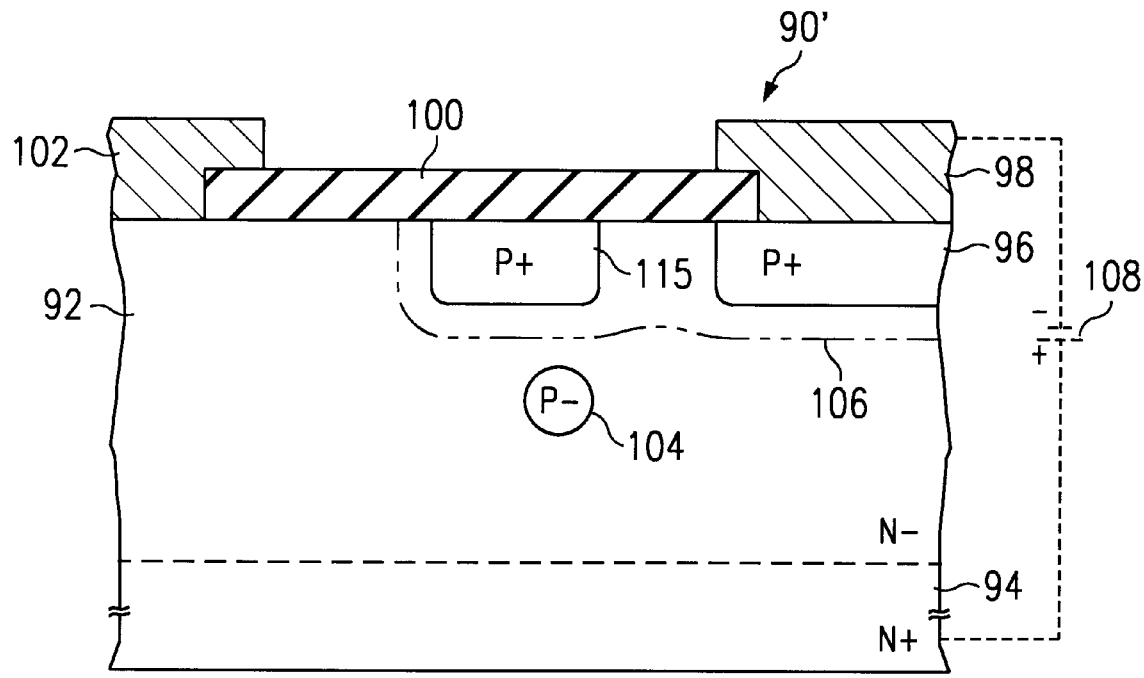
FIG. 6a is a side cross-sectional view of a portion of a termination region of a semiconductor device, showing both a buried field shaping ring and a surface field shaping ring, as well as the main device junction and a depletion region that results when a small reverse voltage is applied, in accordance with a preferred embodiment of the invention.
Figure 6B:
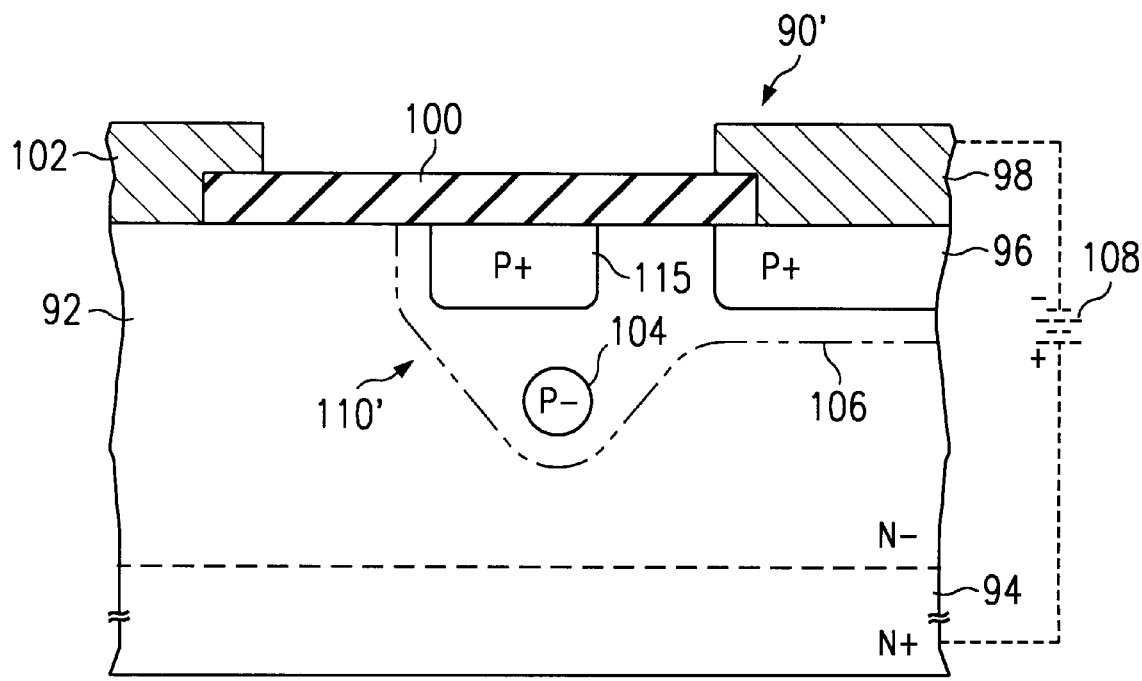
FIG. 6b is a side cross-sectional view of a portion of the semiconductor device of FIG. 6a, showing the depletion region that results when a large reverse voltage is applied, in accordance with a preferred embodiment of the invention.

The structure and method of the invention can be used in conjunction with other existing techniques for increasing the breakdown voltage of transistors and other semiconductor devices. For example, with reference additionally to FIGS. 6a and 6b, the buried field shaping region 104 can be used in conjunction with, for example, surface rings, such as the ring 115 shown, to provide a modified semiconductor device 90'.

The considerations for the location of the buried field shaping region 104 are centrally the same as those described above with reference to the location of the region 104 with respect to the device region 96, except that the location is specified instead with respect to the extent of the surface field shaping ring 115. Thus, as shown, the depletion region 106 with a small voltage applied extends between the surface field shaping ring 115 and the buried field shaping region 104. As the voltage is increased, the depletion region 106 assumes a configuration as shown if FIG. 6b, having a relatively large radius of curvature 110', which is significantly larger than that which would otherwise occur if the buried field shaping region 104 were not present. Other combinations of the method and structure of the invention with existing field shaping structures will be apparent to those skilled in the art.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A semiconductor device, comprising:
a substrate of first conductivity type;
a device region in said substrate of second conductivity type;
a region of second conductivity type in said substrate completely buried in said substrate at a depth below and separated from said device region, said region of second conductivity type being a ring encircling at least a portion of said semiconductor device, said region of second conductivity type having a center located vertically beneath an outermost doped region of second conductivity type of said semiconductor device.

2. The semiconductor device of claim 1 wherein said region of second conductivity type is located at a distance away from said device region sufficient to permit a depletion region to form between said region of second conductivity type and said device region, when a first voltage is applied between said device region and said substrate.

3. The semiconductor device of claim 2 wherein said distance that said region of second conductivity type is located away from said device region is sufficient to produce a radius of curvature of the depletion region, when a second voltage that is larger than said first voltage is applied between said device region and said substrate, that is larger than a radius of curvature of the depletion region about the device region that would be formed if said region of second conductivity type were not present.

4. The semiconductor device of claim 1 wherein said semiconductor device is a portion of an integrated circuit.

5. The semiconductor device of claim 1 wherein said semiconductor device is a discrete device.

6. The semiconductor device of claim 1 further comprising a field shaping region spaced from said device region at a surface of said substrate and spaced from said region of second conductivity type.

7. The semiconductor device of claim 6 wherein said region of second conductivity type is located at a distance away from said field shaping region sufficient to permit a depletion region to form between said region of second conductivity type and said field shaping region, when a first voltage is applied between said device region and said substrate.

8. The semiconductor device of claim 7 wherein said distance that said region of second conductivity type is located away from said field shaping region is sufficient to produce a radius of curvature of the depletion region, when a second voltage that is larger than said first voltage is applied between said device region and said substrate, that is larger than a radius of curvature of the depletion region about the field shaping region that would be formed if said region of second conductivity type were not present.

9. A semiconductor device structure for increasing a breakdown voltage of a junction between a substrate of first conductivity type and a device region, comprising:
a region of second conductivity type in said substrate completely buried in said substrate below and separated from said device region, said region of second conductivity type being a ring surrounding at least a portion of said device region, said region of second conductivity type having a center located vertically beneath an outermost doped region of second conductivity type of said semiconductor device structure.

10. The semiconductor device structure of claim 9 wherein said region of second conductivity type is located at a distance away from said device region sufficient to permit a depletion region to form between said region of second conductivity type and said device region, when a first voltage is applied between said device region and said substrate.

11. The semiconductor device structure of claim 10 wherein said distance that said region of second conductivity type is located away from said device region is sufficient to produce a radius of curvature of the depletion region, when a second voltage that is larger than said first voltage is applied between said device region and said substrate, that is larger than a radius of curvature of the depletion region about the device region that would be formed if said region of second conductivity type were not present.

12. The semiconductor device structure of claim 9 wherein said semiconductor device is a portion of an integrated circuit.

13. The semiconductor device structure of claim 9 wherein said semiconductor device is a discrete device.

14. The semiconductor device structure of claim 9 further comprising a field shaping region spaced from said device region at a surface of said substrate and spaced from said region of second conductivity type.

15. The semiconductor device structure of claim 14 wherein said region of second conductivity type is located at a distance away from said field shaping region sufficient to permit a depletion region to form between said region of second conductivity type and said field shaping region, when a first voltage is applied between said device region and said substrate.

16. The semiconductor device structure of claim 15 wherein said distance that said region of second conductivity type is located away from said field shaping region is sufficient to produce a radius of curvature of the depletion region, when a second voltage that is larger than said first voltage is applied between said device region and said substrate, that is larger than a radius of curvature of the depletion region about the field shaping region that would be formed if said region of second conductivity type were not present.

17. A method for increasing a breakdown voltage of a semiconductor device, comprising:
   providing a substrate of first conductivity type having a device region of second conductivity type therein;
   forming a region of second conductivity type in said substrate completely buried in said substrate at a depth below and separated from said device region by forming a ring encircling at least a portion of said semiconductor device, said region of second conductivity having a center located vertically beneath an outermost doped region of second conductivity type of said semiconductor device.

18. The method of claim 17 wherein said step forming a region of second conductivity type comprises locating said region of second conductivity type at a distance away from said device region sufficient to permit a depletion region to form between said region of second conductivity type and said device region, when a first voltage is applied between said device region and said substrate.

19. The method of claim 18 wherein step of locating said region of second conductivity type comprises locating said region of second conductivity type a distance away from said device region sufficient to produce a radius of curvature of the depletion region, when a second voltage that is larger than said first voltage is applied between said device region and said substrate, that is larger than a radius of curvature of the depletion region about the device region that would be formed if said region of second conductivity type were not present.

20. The method of claim 17 further comprising providing a field shaping region spaced from said device region at a surface of said substrate and spaced from said region of second conductivity type.

21. The method of claim 10 further comprising locating said region of second conductivity type at a distance away from said field shaping region sufficient to permit a depletion region to form between said region of second conductivity type and said field shaping region, when a first voltage is applied between said device region and said substrate.

22. The method of claim 21 wherein said step of locating said region of second conductivity type further comprises locating said field shaping region from said device region a distance sufficient to produce a radius of curvature of the depletion region, when a second voltage that is larger than said first voltage is applied between said device region and said substrate, that is larger than a radius of curvature of the depletion region about the field shaping region that would be formed if said region of second conductivity type were not present.

23. A semiconductor device, comprising:
   a substrate of first conductivity type;
   a device region in said substrate of second conductivity type;
   a region of second conductivity type in said substrate completely buried in said substrate at a depth below and separated from said device region; and
   a field shaping region of second conductivity type spaced from said device region and spaced from said region of second conductivity, said region of second conductivity having a center located vertically beneath said field shaping region.

24. The semiconductor device of claim 23 wherein said region of second conductivity type is located at a distance away from said device region sufficient to permit a depletion region to form between said region of second conductivity type and said device region, when a first voltage is applied between said device region and said substrate.

25. The semiconductor device of claim 24 wherein said distance that said region of second conductivity type is located away from said device region is sufficient to produce a radius of curvature of the depletion region, when a second voltage that is larger than said first voltage is applied between said device region and said substrate, that is larger than a radius of curvature of the depletion region about the device region that would be formed if said region of second conductivity type were not present.

26. The semiconductor device of claim 23 wherein said semiconductor device is a portion of an integrated circuit.

27. The semiconductor device of claim 23 wherein said semiconductor device is a discrete device.

28. The semiconductor device of claim 23 wherein said region of second conductivity has lower doping concentration than said device region.

29. The semiconductor device of claim 23 wherein said region of second conductivity type is located at a distance away from said field shaping region sufficient to permit a depletion region to form between said region of second conductivity type and said field shaping region, when a first voltage is applied between said device region and said substrate.

30. The semiconductor device of claim 29 wherein said distance that said region of second conductivity type is located away from said field shaping region is sufficient to produce a radius of curvature of the depletion region, when a second voltage that is larger than said first voltage is applied between said device region and said substrate, that is larger than a radius of curvature of the depletion region about the field shaping region that would be formed if said region of second conductivity type were not present.

31. A semiconductor device structure for increasing a breakdown voltage of a junction between a substrate of first conductivity type and a device region, comprising:
   a region of second conductivity type in said substrate completely buried in said substrate at a depth below and separated from said device region; and
   a field shaping region of second conductivity type spaced from said device region and spaced from said region of second conductivity, said region of second conductivity having a center located vertically beneath said field shaping region.

32. The semiconductor device structure of claim 31 wherein said region of second conductivity type is located at a distance away from said device region sufficient to permit a depletion region to form between said region of second conductivity type and said device region, when a first voltage is applied between said device region and said substrate.

33. The semiconductor device structure of claim 32 wherein said distance that said region of second conductivity type is located away from said device region is sufficient to produce a radius of curvature of the depletion region, when a second voltage that is larger than said first voltage is applied between said device region and said substrate, that is larger than a radius of curvature of the depletion region about the device region that would be formed if said region of second conductivity type were not present.

34. The semiconductor device structure of claim 31 wherein said semiconductor device is a portion of an integrated circuit.

35. The semiconductor device structure of claim 31 wherein said semiconductor device is a discrete device.

36. The semiconductor device of claim 31 wherein said region of second conductivity has a lower doping concentration than said device region.

37. The semiconductor device structure of claim 31 wherein said region of second conductivity type is located at a distance away from said field shaping region sufficient to permit a depletion region to form between said region of second conductivity type and said field shaping region, when a first voltage is applied between said device region and said substrate.

38. The semiconductor device structure of claim 37 wherein said distance that said region of second conductivity type is located away from said field shaping region is sufficient to produce a radius of curvature of the depletion region, when a second voltage that is larger than said first voltage is applied between said device region and said substrate, that is larger than a radius of curvature of the depletion region about the field shaping region that would be formed if said region of second conductivity type were not present.

39. A method for increasing a breakdown voltage of a semiconductor device, comprising:
   providing a substrate of first conductivity type having a device region of second conductivity type therein;
   forming a region of second conductivity type in said substrate completely buried in said substrate at a depth below and separated from said device region; and
   forming a field shaping region of second conductivity type spaced from said device region and spaced from said region of second conductivity, said region of second conductivity having a center located vertically beneath said field shaping region.

40. The method of claim 39 wherein said step forming a region of second conductivity type comprises locating said region of second conductivity type at a distance away from said device region sufficient to permit a depletion region to form between said region of second conductivity type and said device region, when a first voltage is applied between said device region and said substrate.

41. The method of claim 40 wherein step of locating said region of second conductivity type comprises locating said region of second conductivity type a distance away from said device region sufficient to produce a radius of curvature of the depletion region, when a second voltage that is larger than said first voltage is applied between said device region and said substrate, that is larger than a radius of curvature of the depletion region about the device region that would be formed if said region of second conductivity type were not present.

42. The method of claim 39 further comprising providing said region of second conductivity with a lower doping concentration than said device region.

43. The method of claim 39 further comprising locating said region of second conductivity type at a distance away from said field shaping region sufficient to permit a depletion region to form between said region of second conductivity type and said field shaping region, when a first voltage is applied between said device region and said substrate.

44. The method of claim 43 wherein said step of locating said region of second conductivity type further comprises locating said field shaping region from said field shaping region a distance sufficient to produce a radius of curvature of the depletion region, when a second voltage that is larger than said first voltage is applied between said device region and said substrate, that is larger than a radius of curvature of the depletion region about the field shaping region that would be formed if said region of second conductivity type were not present.

45. The semiconductor device in accordance with claim 1 wherein said outermost doped region comprises said device region.

46. The semiconductor device in accordance with claim 1 wherein said outermost doped region comprises a field shaping region spaced from said device region and spaced from said region of second conductivity.

47. The semiconductor device in accordance with claim 1 wherein said region of second conductivity type has a lower doping concentration than said device region.

48. The semiconductor device structure in accordance with claim 9 wherein said outermost doped region comprises said device region.

49. The semiconductor device structure in accordance with claim 9 wherein said outermost doped region comprises a field shaping region spaced from said device region and spaced from said region of second conductivity.

50. The semiconductor device structure in accordance with claim 9 wherein said region of second conductivity type has a lower doping concentration than said device region.

51. The method in accordance with claim 17 wherein said outermost doped region comprises said device region.

52. The method in accordance with claim 17 wherein said outermost doped region comprises a field shaping region spaced from said device region and spaced from said region of second conductivity.

53. The method in accordance with claim 17 wherein said region of second conductivity type has a lower doping concentration than said device region.

* * * * *